US010032935B2

(12) United States Patent
Higuchi et al.

(10) Patent No.: US 10,032,935 B2
(45) Date of Patent: Jul. 24, 2018

(54) SEMICONDUCTOR MEMORY DEVICE WITH CHARGE-DIFFUSION-LESS TRANSISTORS

(71) Applicant: TOSHIBA MEMORY CORPORATION, Tokyo (JP)

(72) Inventors: Masaaki Higuchi, Yokohama Kanagawa (JP); Masao Shingu, Yokkaichi Mie (JP); Tatsuya Kato, Yokkaichi Mie (JP); Takeshi Murata, Yokkaichi Mie (JP); Makoto Fujiwara, Yokkaichi Mie (JP); Masaki Kondo, Yokkaichi Mie (JP); Muneyuki Tsuda, Ichinomiya Aichi (JP); Takashi Kurusu, Yokkaichi Mie (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/280,013

(22) Filed: Sep. 29, 2016

(65) Prior Publication Data

US 2017/0271527 A1    Sep. 21, 2017

Related U.S. Application Data

(60) Provisional application No. 62/309,418, filed on Mar. 16, 2016.

(51) Int. Cl.

| H01L 29/792 | (2006.01) |
| H01L 27/1157 | (2017.01) |
| H01L 27/11582 | (2017.01) |
| H01L 23/522 | (2006.01) |
| H01L 23/528 | (2006.01) |
| H01L 29/10 | (2006.01) |

(Continued)

(52) U.S. Cl.
CPC .......... H01L 29/7923 (2013.01); G11C 16/08 (2013.01); G11C 16/26 (2013.01); H01L 23/528 (2013.01); H01L 23/5226 (2013.01); H01L 27/1157 (2013.01); H01L 27/11582 (2013.01); H01L 29/1037 (2013.01)

(58) Field of Classification Search
CPC .......... H01L 27/11578; H01L 29/7923; H01L 27/1157; G11C 16/08; G11C 16/26
USPC ........................................ 257/324
See application file for complete search history.

(56) References Cited

U.S. PATENT DOCUMENTS

| 8,759,901 B2 | 6/2014 | Higuchi et al. |
| 9,202,819 B2 | 12/2015 | Lee et al. |

(Continued)

FOREIGN PATENT DOCUMENTS

| JP | 2011066348 A | 3/2011 |
| JP | 2012146773 A | 8/2012 |

*Primary Examiner* — Bo Fan
(74) *Attorney, Agent, or Firm* — Patterson & Sheridan, LLP

(57) ABSTRACT

A semiconductor memory device includes a substrate, a multi-layered structure including a plurality of insulating layers and a plurality of conductive layers that are alternately formed above the substrate, and a pillar extending through the multi-layered structure. The pillar includes a semiconductor body extending along the pillar, and a charge-storing film around the semiconductor body, the charge-storing film having a first thickness at first portions facing the insulating layers and a second thickness greater than the first thickness at second portions facing the conductive layers.

19 Claims, 16 Drawing Sheets

(51) Int. Cl.
*G11C 16/26* (2006.01)
*G11C 16/08* (2006.01)

(56) References Cited

U.S. PATENT DOCUMENTS

| | | |
|---|---|---|
| 9,240,416 B2 | 1/2016 | Shimura et al. |
| 9,275,909 B2 | 3/2016 | Jayanti et al. |
| 2015/0060992 A1* | 3/2015 | Taekyung ........... H01L 29/7926 |
| | | 257/324 |

* cited by examiner

SEMICONDUCTOR MEMORY DEVICE WITH CHARGE-DIFFUSION-LESS TRANSISTORS

CROSS-REFERENCE TO RELATED APPLICATIONS

This application is based upon and claims the benefit of priority from U.S. Provisional Patent Application No. 62/309,418, filed on Mar. 16, 2016, the entire contents of which are incorporated herein by reference.

FIELD

Embodiments described herein relate generally to a semiconductor memory device, in particular a semiconductor memory device with charge-diffusion-less transistors.

BACKGROUND

Improvement of charge-holding characteristics of semiconductor memory devices is desired.

DETAILED DESCRIPTION

Figure 1:
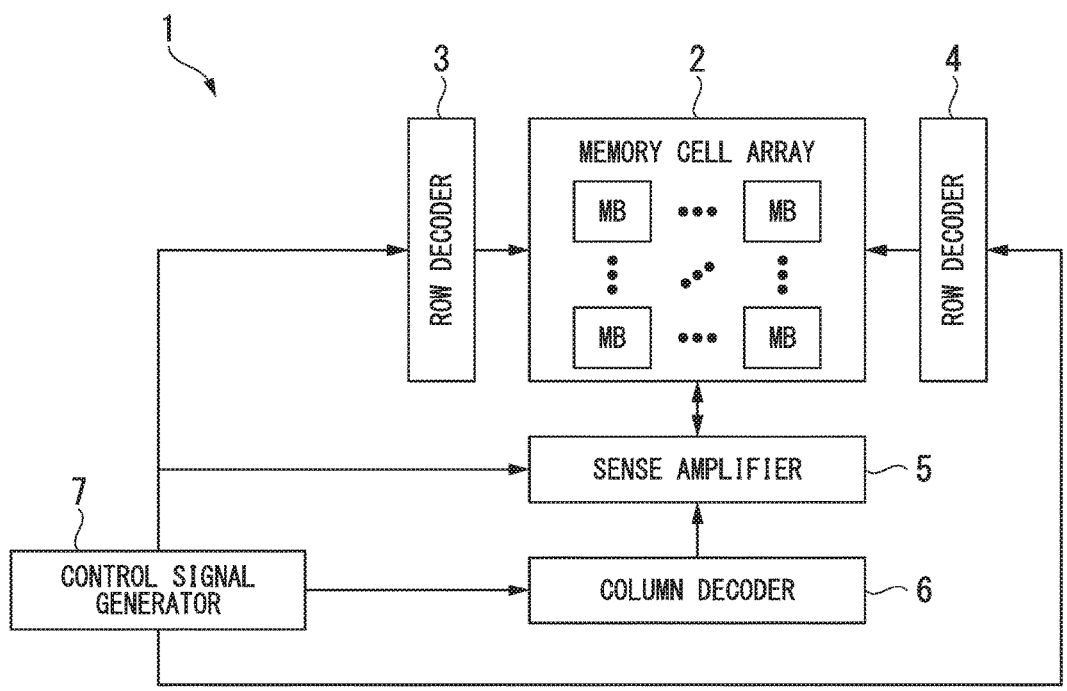
FIG. 1 is a block diagram showing a system configuration of a semiconductor memory device.

According to an embodiment, a semiconductor memory device includes a substrate, a multi-layered structure including a plurality of insulating layers and a plurality of conductive layers that are alternately formed above the substrate, and a pillar extending through the multi-layered structure. The pillar includes a semiconductor body extending along the pillar, and a charge-storing film around the semiconductor body, the charge-storing film having a first thickness at first portions facing the insulating layers and a second thickness greater than the first thickness at second portions facing the conductive layers.

A semiconductor memory device of the embodiments will be described below, with references to the accompanying drawings. In the drawings, common elements are assigned the same reference symbols.

First Embodiment

A configuration of a semiconductor memory device according to a first embodiment will be described below. A semiconductor memory device 1 of the present embodiment is a non-volatile semiconductor memory device, such as a NAND-type flash memory.

FIG. 1 is a block diagram showing a system configuration of the semiconductor memory device 1. As shown in FIG. 1, the semiconductor memory device 1 includes a memory cell array 2, row decoders 3 and 4, a sense amplifier 5, a column decoder 6, and a control signal generator 7.

The memory cell array 2 includes a plurality of memory blocks MB. Each memory block MB includes a plurality of three-dimensionally arranged memory cells MC (refer to FIG. 2). The row decoders 3 and 4 decode a block address signal and the like to control a data write operation and a data read operation with respect to the memory cell array 2. The sense amplifier (sense amplifier circuit) 5 senses and amplifies an electrical signal flowing in the memory cell array 2 at the time of the read operation. The column decoder 6 decodes a column address signal and controls the sense amplifier 5. The control signal generator 7 generates control signals and controls the row decoders 3 and 4, the sense amplifier 5, and the column decoder 6.

Figure 2:
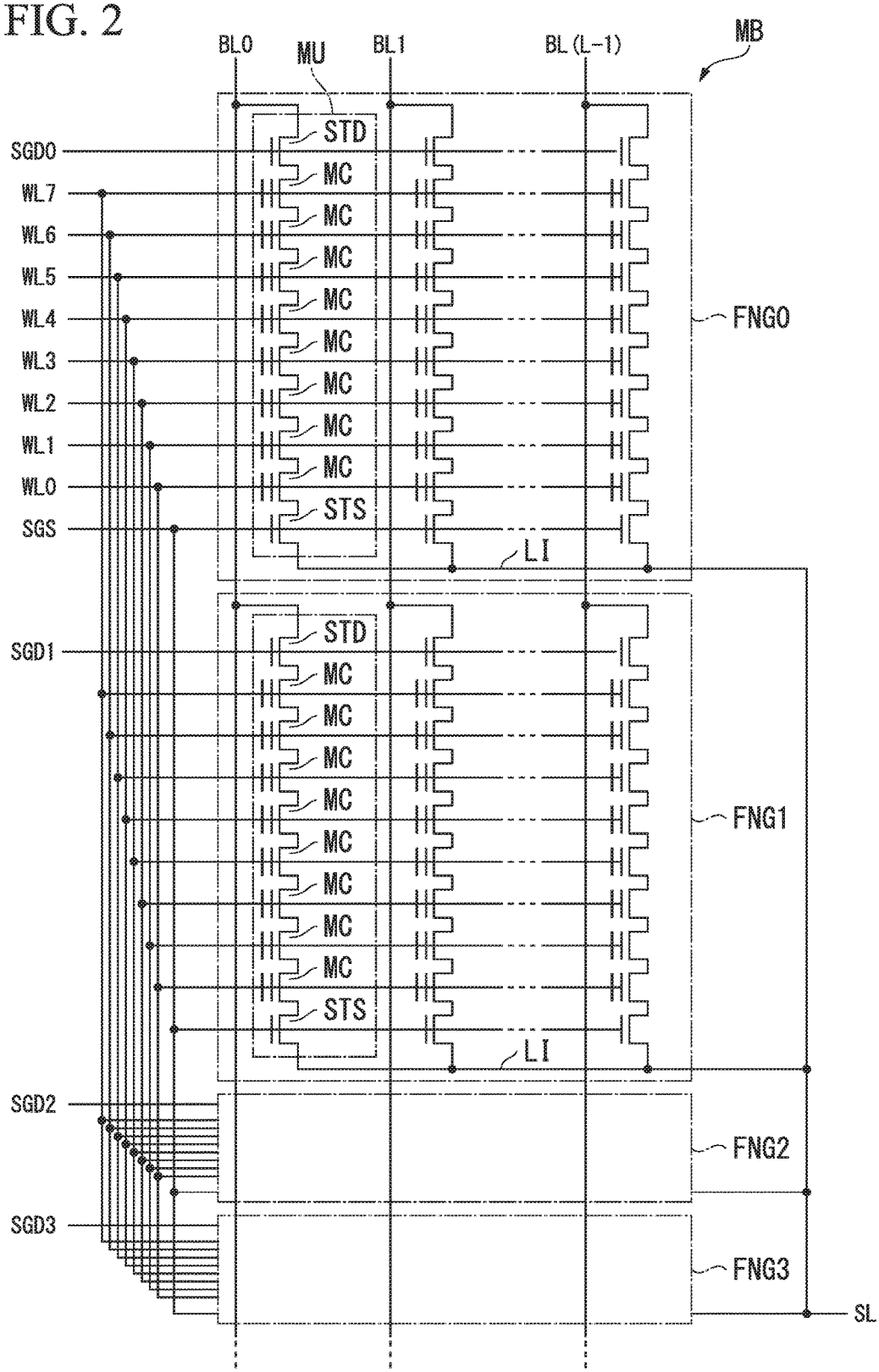
FIG. 2 illustrates an equivalent circuit of a memory cell array of a semiconductor memory device according to a first embodiment.

A circuit configuration of the memory cell array 2 will be described below. FIG. 2 shows an equivalent circuit of the memory cell array 2 according to the present embodiment.

As shown in FIG. 2, each memory block MB includes a plurality of fingers FNG (FNG0, FNG1, . . . ). The fingers FNG are a collection of a plurality of memory cell units MU. In each finger FNG, one end of the memory cell units MU is electrically connected to bit lines BL (BL0, BL1, . . . ). The other end of the memory cell units MU is electrically connected to a source line SL via source contacts LI.

Each memory cell unit MU includes a plurality of memory cells MC, a source-side selection transistor STS and a drain-side selection transistor STD.

The plurality of memory cells MC in a memory cell unit MU is electrically connected in series. Each memory cell MC is a transistor that includes a semiconductor layer, a charge-storing film, and a control gate. Each memory cell MC, in response to application of a voltage to the control gate, stores a charge in the charge-storing film. Each word lines WL (WL0, WL1, and so on) is connected in common to the control gates of the plurality of memory cells MC included in a same row of the different memory cell units MU of the fingers FNG in a memory bock MB. The plurality of memory cells MC are electrically connected to the row decoder 3 or the row decoder 4 via the word lines WL.

In each memory cell unit MU, the source-side selection transistor STS is connected between the plurality of memory cells MC and the source contact LI. The control gate of the source-side selection transistor STS is connected to a source-side selection gate line SGS. The source-side selection gate line SGS is electrically connected to the row decoder 3 or the row decoder 4. The source-side selection gate line SGS is provided to selectively connect between the memory cell units MU of a memory block MB and a semiconductor substrate 11 in accordance with an input signal (refer to FIG. 3).

In each memory cell unit MU, the drain-side selection transistor STD is connected between the plurality of memory cells MC and a corresponding bit line BL. The control gate of the drain-side selection transistor STD is connected to one of drain-side selection gate lines SGD (SGD0, SGD1, and so on). The drain-side selection gate lines SGD are electrically connected to the row decoder 3 or the row decoder 4. Each of the drain-side selection gate lines SGD is provided to selectively connect between memory cell units MU of a finger FNG and the bit lines BL in accordance with an input signal.

The structure of the memory cell array 2 will be described below. The memory cell array 2 includes a memory area. The memory area refers to a region in which the plurality of memory cells MC is formed.

Figure 3:
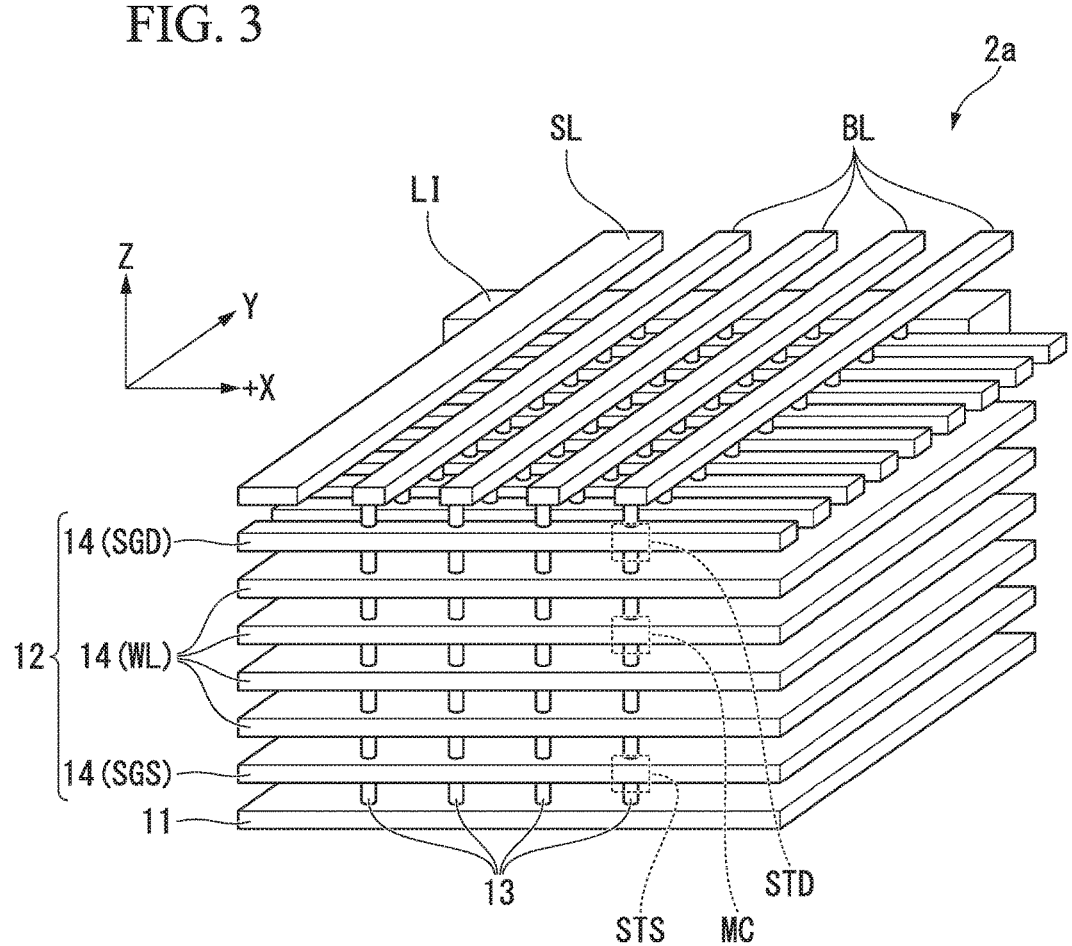
FIG. 3 is a perspective view of a memory area of the memory cell array according to the first embodiment.

FIG. 3 schematically illustrates the structure of a memory area 2a of the memory cell array 2 in the present embodiment. In FIG. 3, an insulating material into which the memory cell array 2 is formed and the like are not illustrated.

X direction, Y direction, and Z direction are defined as follows. X direction and Y direction are directions along a surface of the semiconductor substrate 11. X direction is a direction in which the source contact LI extends, and Y direction is a direction intersecting (for example, substantially orthogonally) with X direction. Z direction is a direction intersecting with (for example, substantially orthogonally) X direction and Y direction and is a thickness direction of the semiconductor substrate 11.

As shown in FIG. 3, the memory area 2a of the memory cell array 2 includes the semiconductor substrate 11, a multi-layered structure 12, pillars 13, the source contact LI, the bit lines BL, and the source line SL.

The semiconductor substrate 11 is an example of a substrate and is formed in a plate shape.

The multi-layered structure 12 is formed on the semiconductor substrate 11. The multi-layered structure 12 includes a plurality of conductive layers 14 and a plurality of insulating layers 15 (refer to FIG. 4). The plurality of conductive layers 14 and the plurality of insulating layers 15 are stacked alternately on the semiconductor substrate 11 in Z direction. The conductive layers 14 include a conductor 14A and a cover layer 14B (shown in FIG. 4). Examples of the conductor 14A may include, but are not limited to, tungsten (W) and polysilicon (Poly-Si). Examples of the cover layer 14B may include, but are not limited to, titanium nitride (TiN). The cover layer 14B covers the conductor 14A. Examples of the insulating layers 15 may include, but are not limited to, silicon oxide ($SiO_2$) and the like. The thickness of the insulating layer 15 may be, but not limited to, 35 nm or less. A blocking layer 51 is formed between the conductive layer 14 and the insulating layer 15 (refer to FIG. 4). The blocking layer 51 is made of, for example, alumina.

The plurality of conductive layers 14 forms the plurality of word lines WL, the source-side selection gate line SGS, and the drain-side selection gate lines SGD. Of the plurality of conductive layers 14, for example, the one nearest to the semiconductor substrate 11 forms the source-side selection gate line SGS. Of the plurality of conductive layers 14, for example, the one farthest from the semiconductor substrate 11 forms the drain-side selection gate lines SGD. Of the plurality of conductive layers 14, the plurality of conductive layers 14 positioned between the source-side selection gate line SGS and the drain-side selection gate lines SGD form the plurality of the word lines WL.

Each pillar 13 extends in Z direction and passes through the source-side selection gate line SGS, the plurality of word lines WL, and one of the drain-side selection gate lines SGD. Intersections of the pillars 13 and the source-side selection gate line SGS form the source-side selection transistors STS. Intersections of the pillars 13 and the word lines WL form the memory cells MC. Intersections of the pillars 13 and the drain-side selection gate lines SGD form the drain-side selection transistors STD.

The source contact LI faces a side surface of the multi-layered structure 12 in Y direction. The source contact LI extends in X direction. The source contact LI is connected to the semiconductor substrate 11. The source contact LI is connects the source line SL and the semiconductor substrate 11.

The bit lines BL and the source line SL are formed at a side of the multi-layered structure 12 opposite to a side facing the semiconductor substrate 11, sandwiching the multi-layered structure 12 and the pillars 13 therebetween. The bit lines BL and the source line SL are disposed with a gap therebetween in X direction and each extends in Y direction. The bit lines BL are electrically connected to the pillars 13. The source line SL is electrically connected to the source contact LI.

The vicinity of the memory cell MC of the memory area 2a will be described below.

Figure 4:
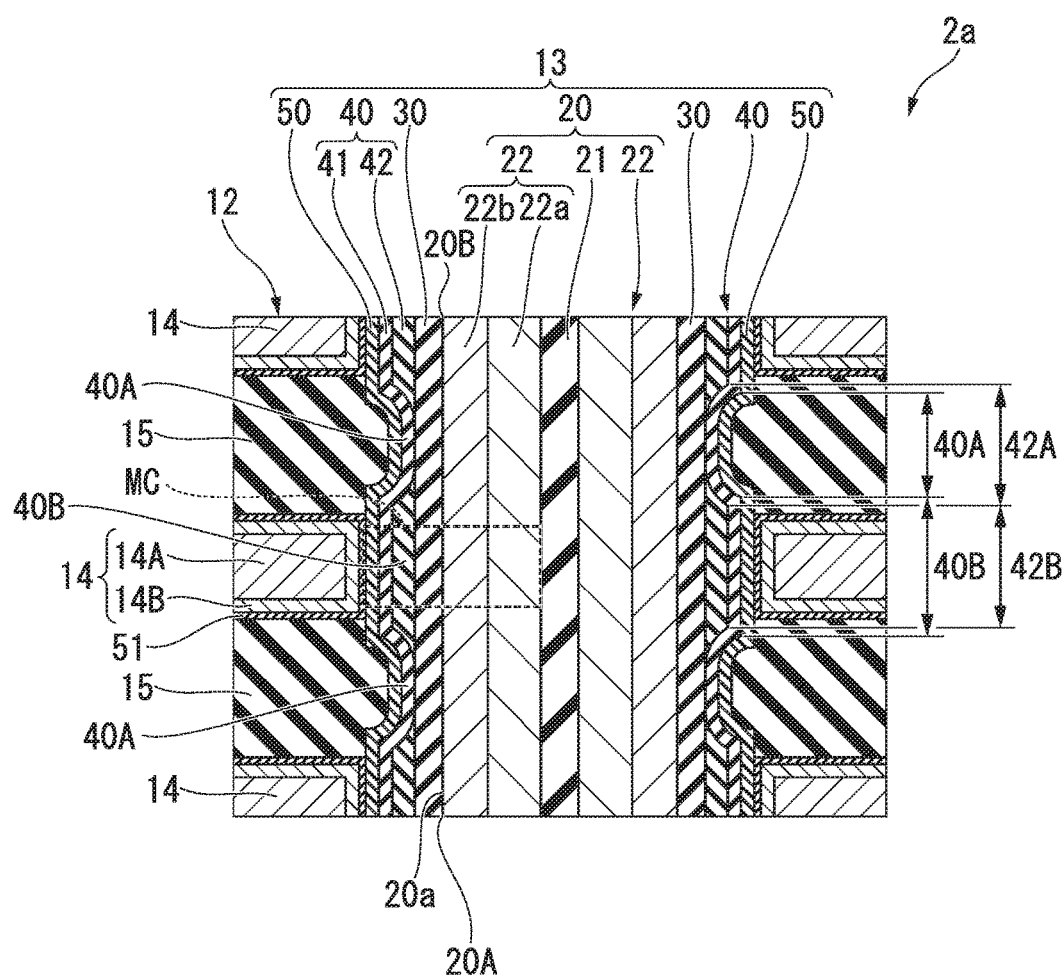
FIG. 4 is a cross-sectional view of a memory cell of the memory area in the first embodiment.

FIG. 4 is a cross-sectional view of the memory area 2a of the semiconductor memory device according to the present embodiment. As shown in FIG. 4, the pillar 13 is formed in the multi-layered structure 12 and passes through the conductive layers 14 and the insulating layers 15. Hereinafter, a core side of the pillar 13 may be referred to as an inside, and its opposite side may be referred to as an outside. The pillar 13 has, in sequence from the outside surface of the semiconductor body 20, a tunnel insulating film 30, a charge-storing film 40, and a blocking insulation film 50.

The semiconductor body 20 is formed as a core portion of the pillar 13 and extends in Z direction. The semiconductor body 20 has a core insulating layer 21 and a semiconductor layer 22. Examples of the core insulating layer 21 may include, but are not limited to, silicon oxide ($SiO_2$). The semiconductor layer 22 covers the side surface (circumferential surface) of the core insulating layer 21. The semiconductor layer 22 has, for example, a cover layer 22a and a channel layer 22b. Examples of the cover layer 22a and the channel layer 22b may include, but are not limited to, polysilicon (Poly-Si). The cover layer 22a and the channel layer 22b function as a channel of the memory cell MC.

The outside surface 20a of the semiconductor body 20 is formed smoothly (without unevenness). In this case, the "unevenness" may not include microscopic unevenness of a negligible degree. In the cross-sectional view of the memory cell MC taken along a direction in parallel to Z direction, passing through the center of the semiconductor body 20 in Z direction (hereinafter referred to as a vertical cross-section of a pillar) a straight line connecting an arbitrary point 20A on the outside surface 20a of the semiconductor body 20 with another arbitrary point 20B positioned with more distance than the arbitrary point 20A from the substrate 11 substantially coincides with the outside surface 20a of the semiconductor body 20.

The tunnel insulating film 30 is formed between the multi-layered structure 12 and the outside surface 20a of the semiconductor body 20. The tunnel insulating film 30 covers the outside surface (circumferential surface) of the semiconductor body 20. Examples of the tunnel insulating film 30 may include, but are not limited to, silicon oxide ($SiO_2$).

The charge-storing film 40 is provided between the multi-layered structure 12 and the tunnel insulating film 30. The charge-storing film 40 covers the side surface (circumferential surface) of the tunnel insulating film 30, and includes a thin part 40A and a charge-storing part 40B.

The thin part 40A is a part in which the charge-storing film 40 is thinner than a part of the charge-storing film 40 between the conductive layer 14 and the tunnel insulating film 30. In the thin part 40A, the charge-storing film 40 is formed so as to be recessed toward the semiconductor body 20. The thin part 40A is formed between the insulating layer 15 and the tunnel insulating film 30.

The "thickness of the charge-storing film 40" refers to the thickness thereof in the vertical cross-section of a pillar. More specifically, in the vertical cross-section of a pillar, the thickness is the distance between the point at which the line perpendicular to the outside surface 20a of the semiconductor body 20 intersects with the outside surface of the charge-storing film 40, and, the point at which the line perpendicular to the outside surface 20a of the semiconductor body 20 intersects with the inside surface of the charge-storing film 40.

The charge-storing part 40B is a part of the charge-storing film 40 other than the thin part 40A. The charge-storing part 40B is formed between the conductive layer 14 and the tunnel insulating film 30.

Figure 5:
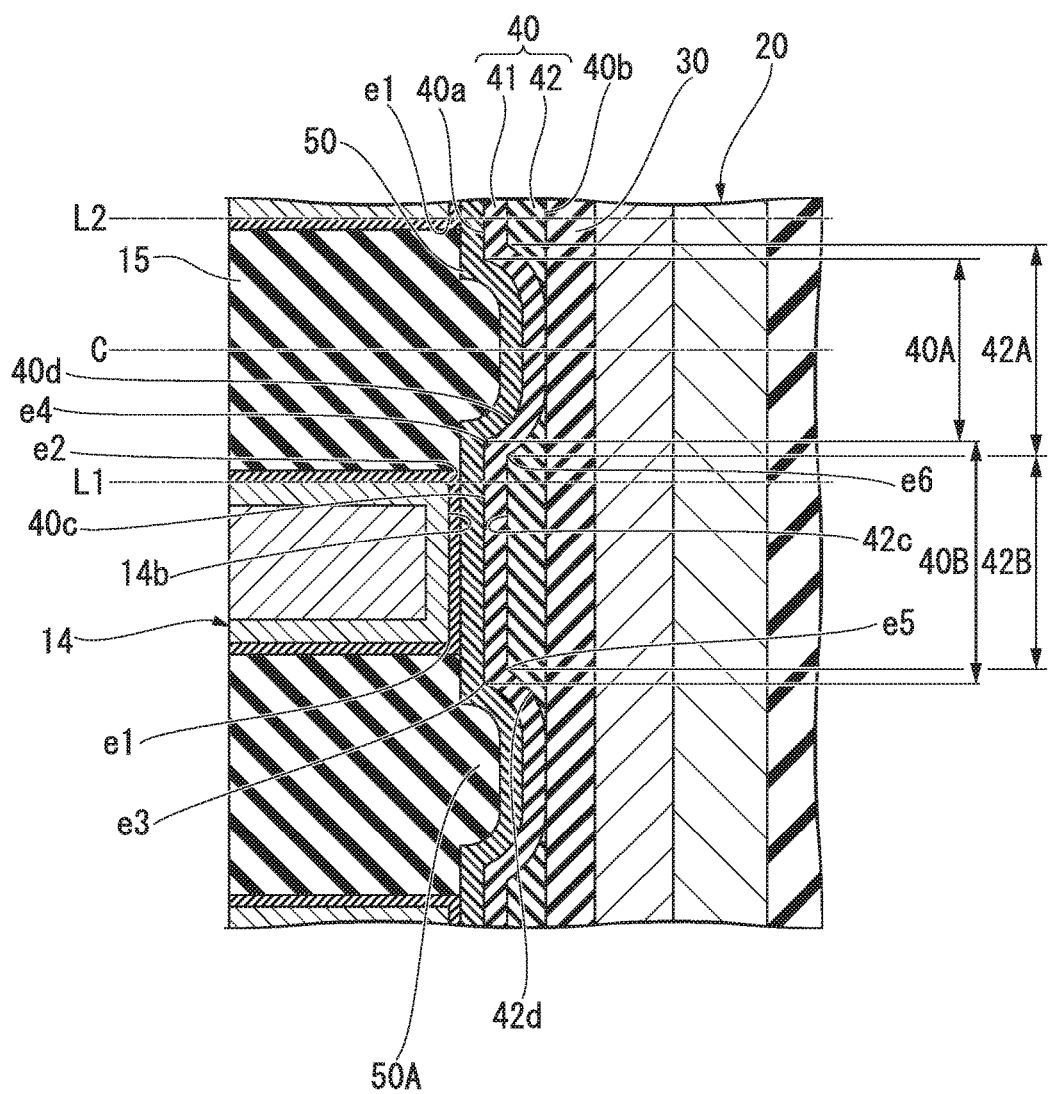
FIG. 5 is a cross-sectional view of a portion of the memory cell of the memory area in the first embodiment.

FIG. 5 is an enlarged cross-sectional view of a memory cell MC of the semiconductor storage device according to the present embodiment.

The width of the charge-storing part 40B of the charge-storing film 40 along Z direction is larger than that of the first surface 14b of the conductive layer 14 on the side of the semiconductor body 20.

The "width of the first surface 14b" refers to the distance between a first edge e1 and a second edge e2 in the vertical cross-section of the first surface 14b of one conductive layer 14 on the side of the semiconductor body 20. The first edge e1 is an edge on the substrate side of the first surface 14b of one conductive layer 14 in the vertical cross-section, and the second edge e2 is an edge of the first surface 14b at the side opposite to the substrate 11.

The "width of the charge-storing part 40B along Z direction" refers to the distance between a third edge e3 and a fourth edge e4 in the vertical cross-section of a pillar of a first opposing surface 40c of the charge-storing film 40 that opposes the first surface 14b of the conductive layer 14. The third edge e3 is an edge on the substrate side of the first opposing surface 40c in the vertical cross-section, and the fourth edge e4 is an edge of the first opposing surface 40c at the side opposite to the substrate.

The edge of the thin part 40A of the charge-storing film 40 in Z direction contacts the charge-storing part 40B as the film thickness becomes continuously larger. That is, the first surface 40a of the charge-storing film 40 has a first inclined surface 40d that widens from the first opposing surface 40c towards the tunnel insulating film 30. The first inclined surface 40d has a curved surface protruding toward the tunnel insulating film 30.

The charge-storing film 40, as shown in FIG. 4 and FIG. 5, has a stacked structure of a first-composition film 41 and a second-composition film 42 that have different compositions. The electric charge trap level of the second-composition film 42 is greater than that of the first-composition film 41. That is, the second-composition film 42 can trap more electrons than can the first-composition film 41. In the first-composition film 41, charge transfer is less likely to occur than in the second-composition film 42.

Examples of the first-composition film 41 may include, but are not limited to, silicon nitride (SiN) and silicon oxynitride (SiON). The silicon nitride and silicon oxynitride included in the first-composition film 41 are preferably close to stoichiometric state.

The second-composition film 42 may be formed of, but not limited to, silicon nitride (SiN) or the like that is more silicon-rich than stoichiometric silicon nitride.

The first-composition film 41 extends in Z direction. The shape of the outside surface of the first-composition film 41 conforms to the shape of inner wall of the memory hole formed around the pillar 13. At least one part of the insulating layer 15 forming the inner wall of the memory hole protrudes toward the semiconductor body 20 from the conductive layer 14 forming the inner wall of the memory hole. For this reason, the shape of the outside surface of the first-composition film 41 is uneven.

The first-composition film 41 is formed at the position of an intersection with the center surface in the thickness direction of the insulating layer 15. That is, at least a part of the thin part 40A includes the first-composition film 41. In this case, the center surface in the thickness direction is a surface parallel to the substrate 11 and expressed as the center line C in the vertical cross-section of a pillar. The center line C is a straight line that is equidistant to a first virtual line L1 and a second virtual line L2 in the vertical cross-section of a pillar. The first virtual line L1 passes through a second edge e2 of one conductive layer 14 and is parallel to the substrate 11. The second virtual line L2 passes through a first edge e1 of the conductive layer adjacent to the conductive layer 14 on the side opposite to the substrate, on which the first virtual line L1 is drawn, and is parallel to the substance 11.

The second-composition film 42 is formed between the first-composition film 41 and the tunnel insulating film 30. At least one part of the second-composition film 42 is formed at a position overlapping with the conductive layer 14 in Z direction. The second-composition film 42 is in contact with the tunnel insulating film 30.

The second-composition film 42 has a second thin part 42A and a second charge-storing part 42B.

The second thin part 42A is a part of the second-composition film 42 thinner than the part between the conductive layer 14 and the tunnel insulating film 30, and formed between the insulating layer 15 and the tunnel insulating film 30.

The second charge-storing part 42B is a part of the second-composition film 42 other than the second thin part 42A and formed between the conductive layer 14 and the insulating film 30.

As shown in FIG. 5, the thickness of a part of the second thin part 42A may be zero. That is, a part of the second-composition film 42 may be separated in the stacking direction. In this case, it is the "second-composition part," rather than the "second-composition film". Because the second-composition film 42 is formed as a continuous film in the manufacturing process, it will be referred to as the "second-composition film" in the present specification.

The width of the second charge-storing part 42B in Z direction is larger than the width of the first surface 14b of the conductive layer 14 facing the semiconductor body 20, in the stacking direction. The "width of the second charge-storing part 42B in the stacking direction" refers to the distance between a fifth edge e5 and a sixth edge e6 of the second opposing surface 42c that opposes the first surface 14b in the vertical cross-section. The fifth edge e5 is an edge at the substrate side of the second opposing surface 42c in the vertical cross-section, and the sixth edge e6 is an edge at the side opposite from the substrate.

The edge of the second thin part 42A of the second-composition film 42 in Z direction contacts the second charge-storing part 42B, as the film thickness becomes continuously larger. That is, the second charge-storing part 40B has a second inclined surface 42d that widens from the second opposing surface 42c towards the tunnel insulating film 30. The second inclined surface 42d has a curved surface protruding toward the tunnel insulating film 30.

The blocking insulation film 50 is formed between the multi-layered structure 12 and the charge-storing film 40. The blocking insulation film 50 covers the side surface (circumferential surface) of the charge-storing film 40. The blocking insulation film 50 extends in the stacking direction of the multi-layered structure 12.

The shape of the blocking insulation film 50 conforms to the shape of the inner wall of the memory hole formed around the pillar 13. The blocking insulation film 50, thus, has a recess 50A that is recessed toward the semiconductor body 20 along the thin part 40A. Examples of the blocking insulation film 50 may include, but are not limited to, silicon oxide ($SiO_2$).

A first example of a method of manufacturing the semiconductor memory device 1 according to the present embodiment will be described with reference to FIG. 6 to FIG. 12. FIG. 6 to FIG. 12 are cross-sectional views of a layered structure to show a first example of a method of manufacturing the semiconductor memory device according to the present embodiment. The following is a description of the formation of the multi-layered structure 12 and the pillar 13. In FIG. 6 to FIG. 12, the semiconductor substrate 11 is not shown.

Figure 6:
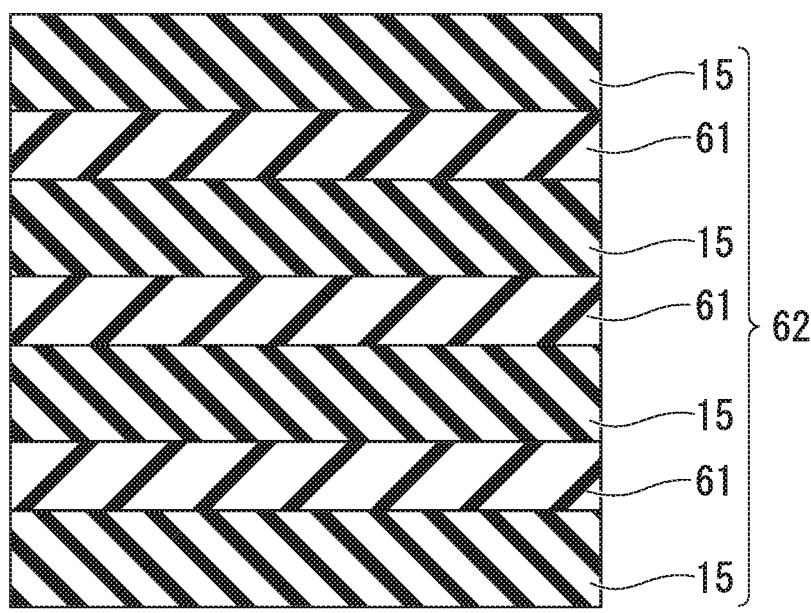
FIGS. 6 through 12 are cross-sectional views of layers to show a first example of a method of manufacturing the memory area according to the first embodiment.

As shown in FIG. 6, the insulating layer 15 and a substitution layer (sacrificial layer) 61 are alternately stacked to obtain stacked layers 62. The first layer stacked on the semiconductor substrate 11 is the insulating layer 15. Each of the substitution layers 61 is later replaced by the conductive layer 14. The substitution layer 61 is formed of a material different from the insulating layer 15. If silicon oxide, for example, is selected as the insulating layer 15, silicon nitride is selected as the substitution layer 61.

Figure 7:
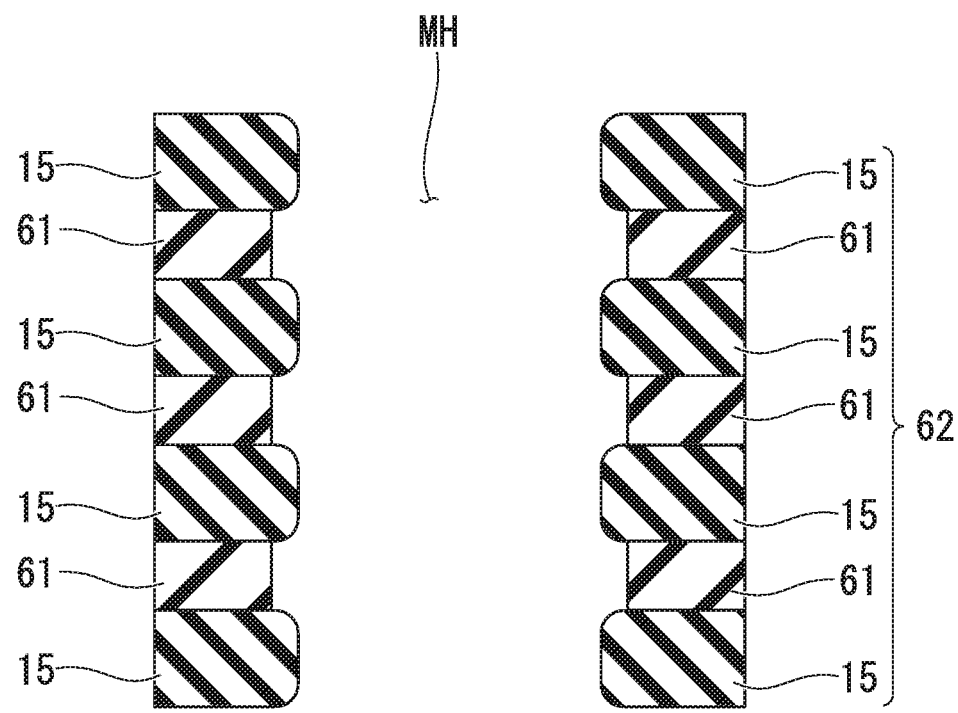

As shown in FIG. 7, a memory hole MH is formed in the stacked layers 62. The memory hole MH is formed, for example, by RIE (reactive ion etching) using a mask formed on the stacked layers 62. The inner wall of the memory hole MH is etched by heated phosphoric acid (hot phosphoric acid) or the like. Because of high etching selectivity ratio of the substitution layer 61 with respect to the insulating layer 15, the surface of the substitution layer 61 exposed in the memory hole MH recedes.

Figure 8:
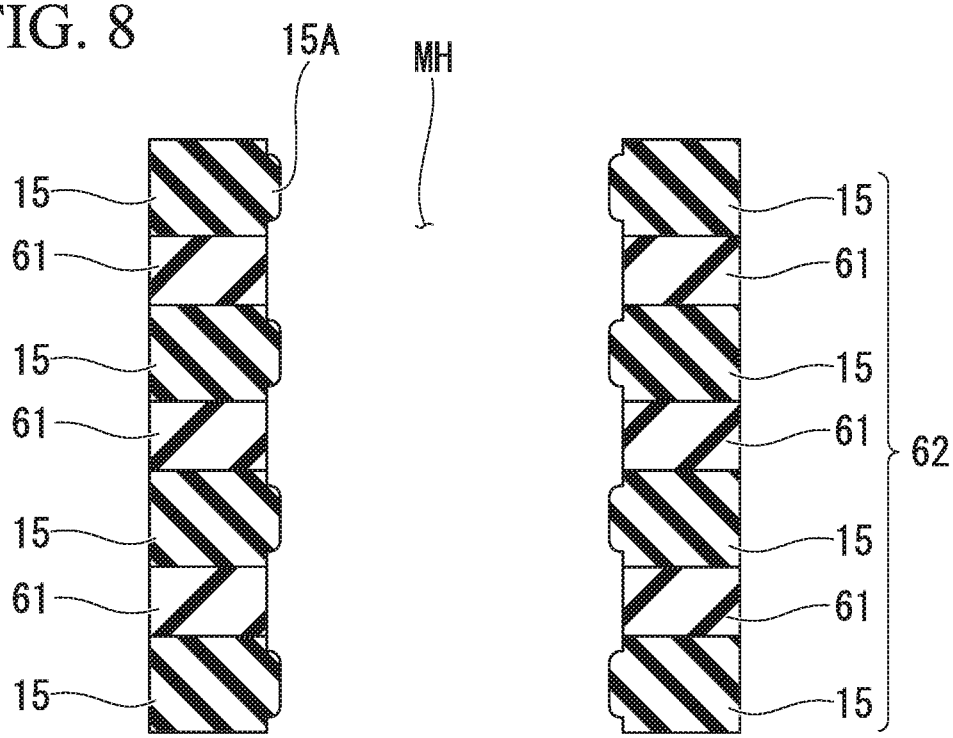

As shown in FIG. 8, the inner wall of the memory hole MH is etched using an etching material having higher etching selectivity ratio of the insulating layer 15 with respect to the substitution layer 61. As the etching material, for example, hydrofluoric acid is used. The insulating layer 15 that is exposed in the memory hole MH is etched isotropically and a protrusion 15A is formed.

Figure 9:
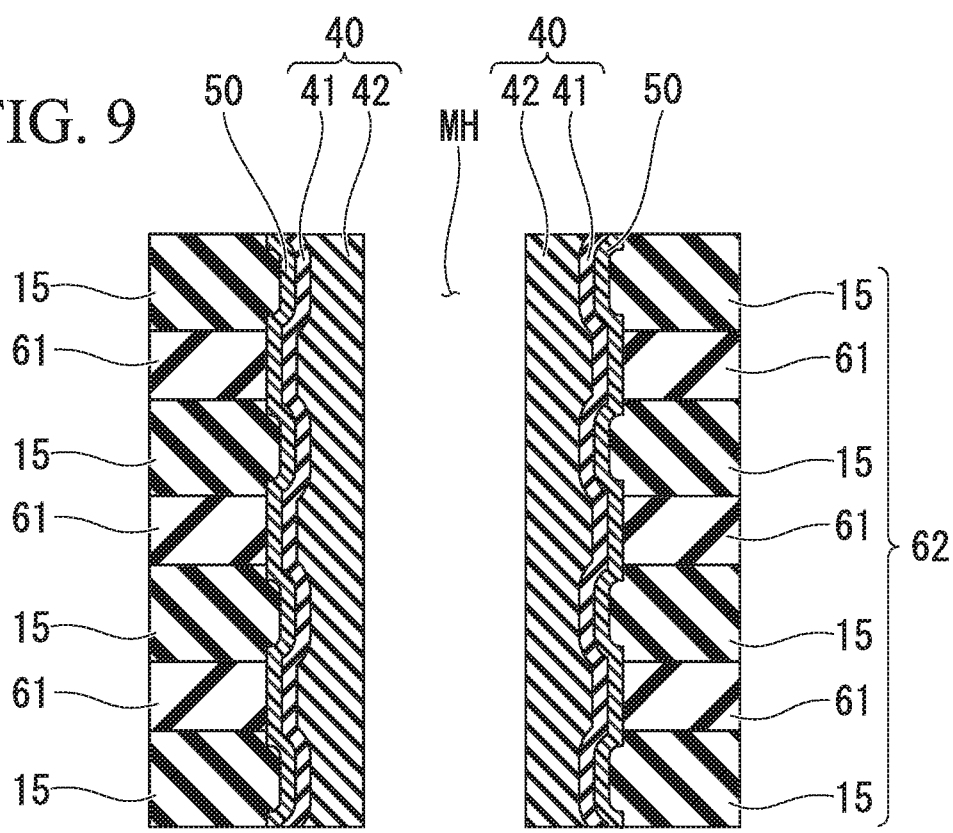

As shown in FIG. 9, the blocking insulation film 50 and the charge-storing film 40 are stacked in this order. The blocking insulation film 50 and the charge-storing film 40 are formed by CVD (chemical vapor deposition) or the like. The blocking insulation film 50 and the first-composition film 41 of the charge-storing film 40 are deposited such that a thickness thereof conforms to the shape of the inner wall of the memory hole MH. In contrast, the second-composition film 42 continues to be deposited until it fills the unevenness of the inner wall of the memory hole MH. Isotropic deposition of the second-composition film 42 results in filing the recess between the neighboring protrusions 15A.

Figure 10:
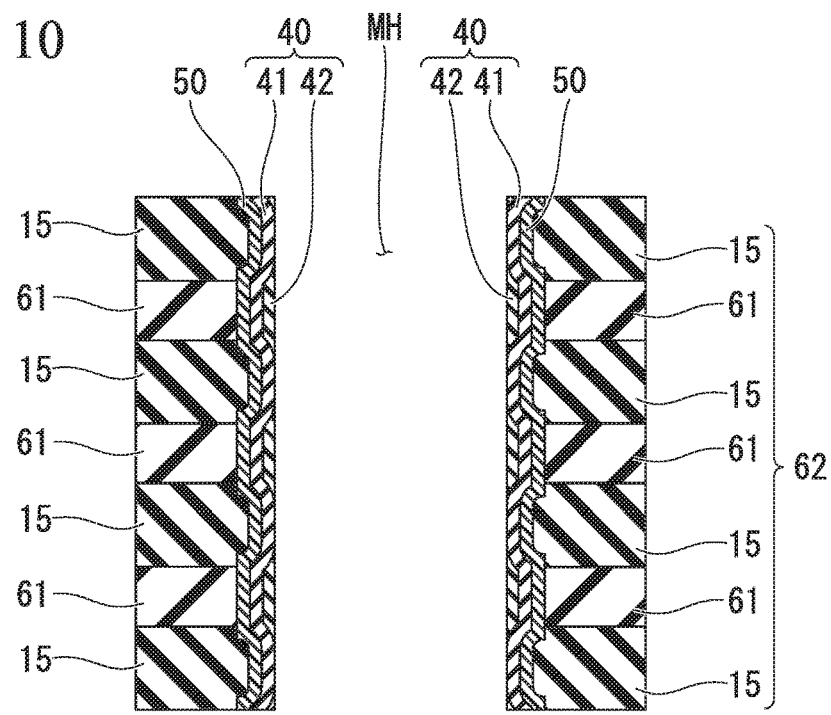

As shown in FIG. 10, a part of the charge-storing film 40 is removed from the inside of the memory hole MH. The removal of the charge-storing film 40 proceeds as follows. First, a radical oxidation is done to oxidize the charge-storing film 40 from the inner wall side. A specific method of the radical oxidation that is used is, for example, to form an oxide film by directly introducing hydrogen and oxygen into the film deposition chamber and generating water vapor therein. The oxidation of the charge-storing film 40 is stopped before it reaches the blocking insulation film 50. By leaving a part of the charge-storing film 40, removal of the block insulating film 50 and the insulating layer 15 along with the removal of the oxidized charge-storing film 40 is prevented. The oxidized charge-storing film 40 is etched by dilute hydrofluoric acid and the like.

Figure 11:
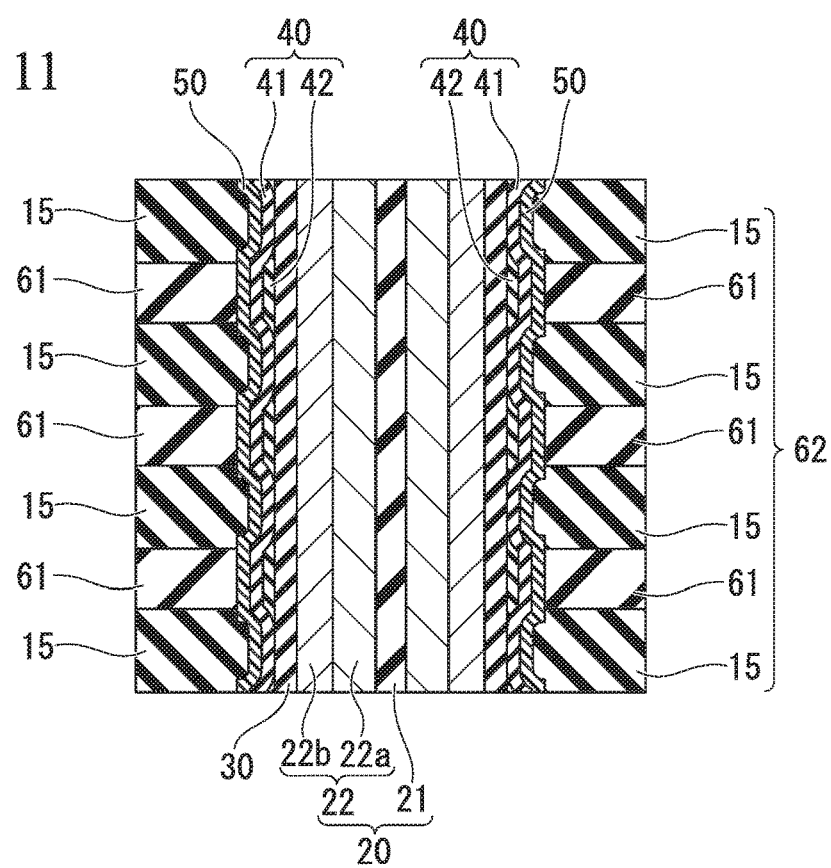

As shown in FIG. 11, the tunnel insulating film 30 and the semiconductor body 20 are formed on the inner wall from which a part of the charge-storing film 40 had been removed. The semiconductor body 20 is formed by a channel layer 22b, a cover layer 22a, and a core insulating film 21 in this order.

Figure 12:
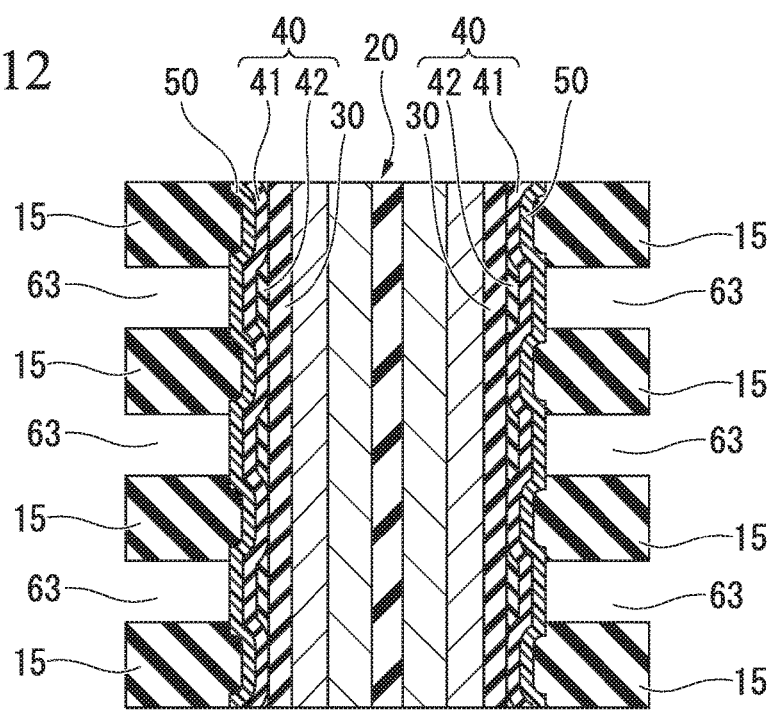

As shown in FIG. 12, the substitution layer 61 is removed. The removal of the substitution layer 61 is performed by etching using heated phosphoric acid (hot phosphoric acid) or the like. After removal of the substitution layer 61, spaces 63 are formed between neighboring insulating films 15.

Finally, as shown in FIG. 4, the blocking layer 51 is formed within each of the spaces 63. Additionally, the cover layer 14B and the conductor 14A are stacked inside the blocking layer 51 in that sequence, thereby obtaining the conductive layer 14A.

The semiconductor memory device according to the present embodiment may also be manufactured by a method other than the first example. A second example of the method for manufacturing the semiconductor memory device 1 of the present embodiment will be described with reference to FIG. 13 to FIG. 17. FIG. 13 to FIG. 17 are cross-sectional views of stacked layers to show the second example of the method of manufacturing the semiconductor memory device according to the present embodiment. The following is the description of formation of the multi-layered structure 12 and the pillar 13. In FIG. 13 to FIG. 17, the semiconductor substrate 11 is not shown.

First, similarly to the first example, the memory hole MH is formed in the stacked layers 62. Because the blocking layer 51 is formed thick, the insulating layer 15 may be thinner and the substitution layer 61 may be thicker than the stacked layers 62 in the first example. Then, an exposed surface at the side of the memory hole MH of the substitution layer 61 recedes. The exposed surface at the side of the memory hole MH of the insulating layer 15 is not exposed, which is different from the first example.

Figure 13:
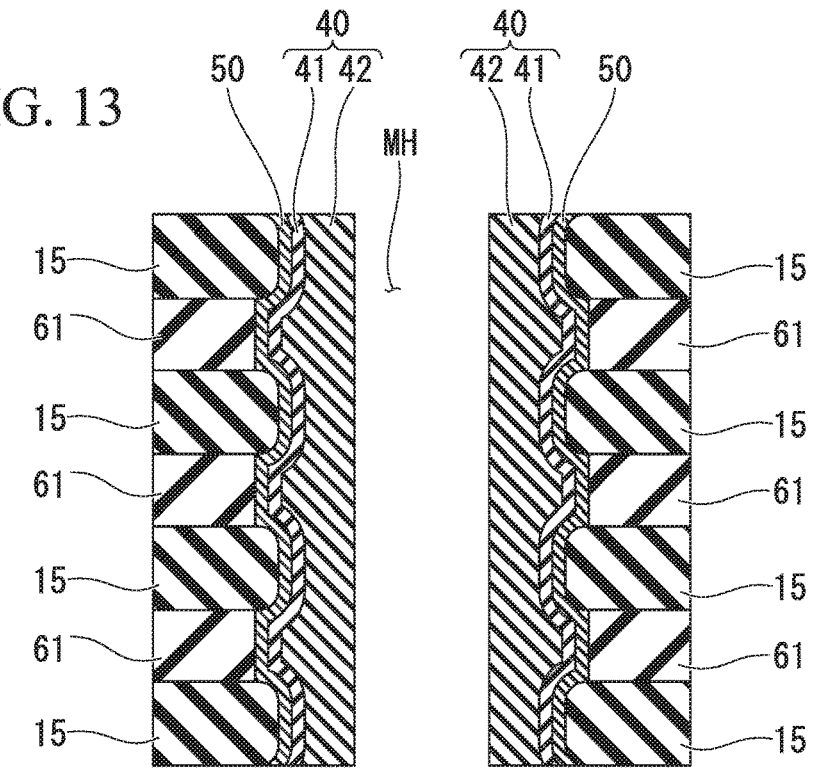
FIGS. 13 through 17 are cross-sectional views of layers to show a second example of a method of manufacturing the memory area according to the first embodiment.

As shown in FIG. 13, the blocking insulation film 50 and the charge-storing film 40 are stacked in this order. The method of stacking the blocking insulation film 50 and the charge-storing film 40 is the same as that in the first example.

Figure 14:
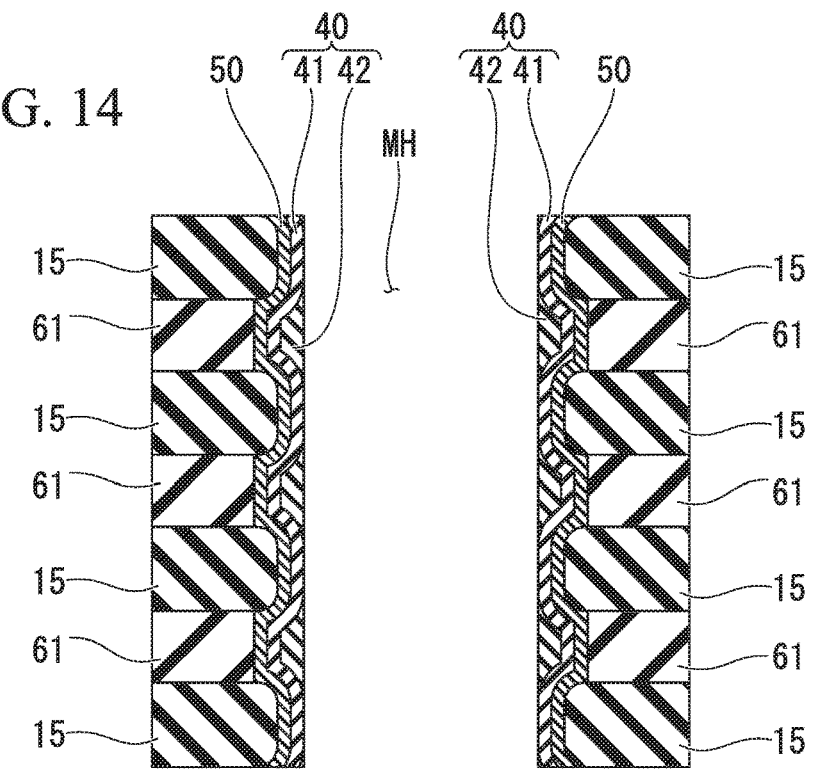

As shown in FIG. 14, a part of the charge-storing film 40 is removed from the inside of the memory hole MH. Similarly to the first example, the removal of the charge-storing film 40 is done by radical oxidation processing, followed by removing the oxide film using dilute hydrofluoric acid or the like.

Figure 15:
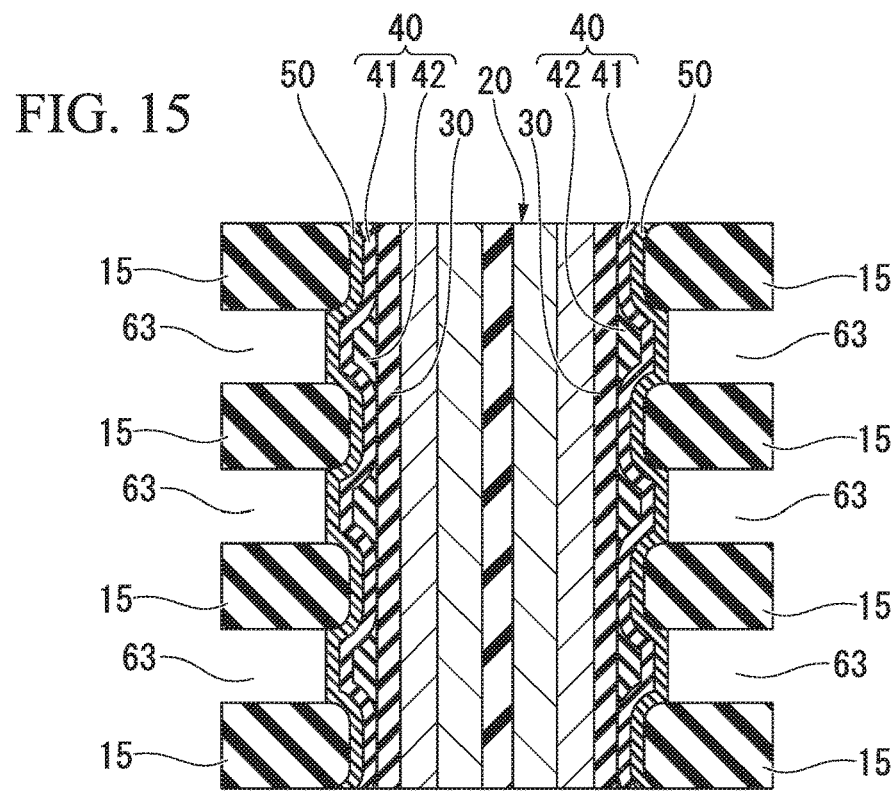

As shown in FIG. 15, the tunnel insulating film 30 and the semiconductor body 20 are formed on the inner wall from which a part of the charge-storing film 40 had been removed. After formation of the semiconductor body 20, the substitution layer 61 is removed. After removal of the substitution layer 61, spaces 63 are formed between neighboring insulating layers 15. The method of manufacturing the semiconductor body 20 and the method of removing the substitution layer 61 may be the same as that in the first example.

Figure 16:
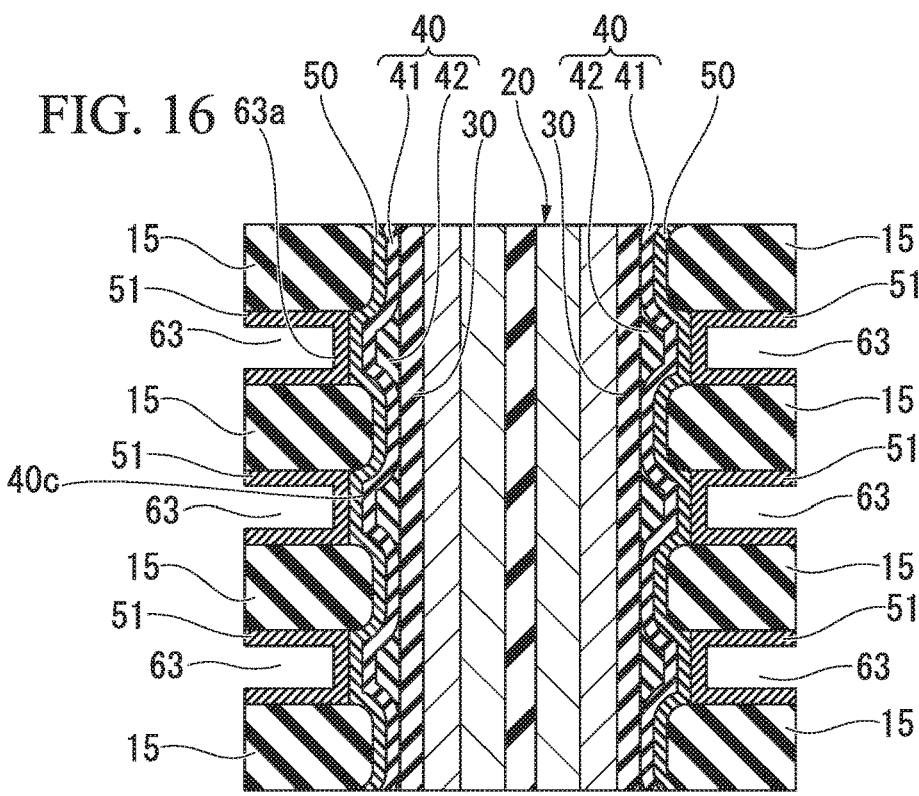

As shown in FIG. 16, the blocking layer 51 is formed in each of the spaces 63. The blocking layer 51 is deposited thicker than in the first example. For example, the blocking layer 51 is deposited until the width of the surface 63a of the space 63, which faces the charge-storing film 40, becomes shorter than the width of the first opposing surface 40c of the charge-storing film 40 in Z direction.

Figure 17:
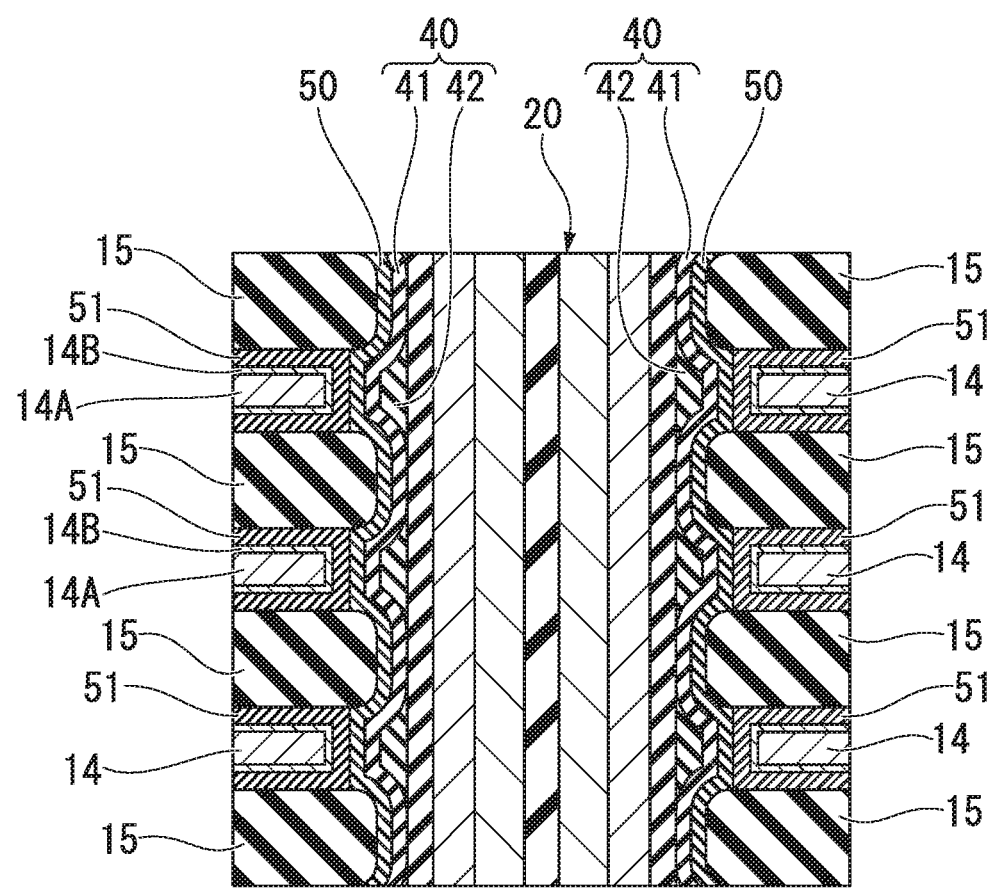

Finally, as shown in FIG. 17, the cover layer 14B and the conductor 14A are stacked in this order, and as a result the conductive layer 14 is formed. This process results in the ratio of the width of the conductive layer 14 to that of the insulating layer 15 being equal to that of the first example.

In the above process, the method of the second example can also be employed to manufacture the semiconductor memory device of the present embodiment.

According to the above-described configuration, the charge-holding characteristics of the semiconductor memory device can be improved.

Figure 18:
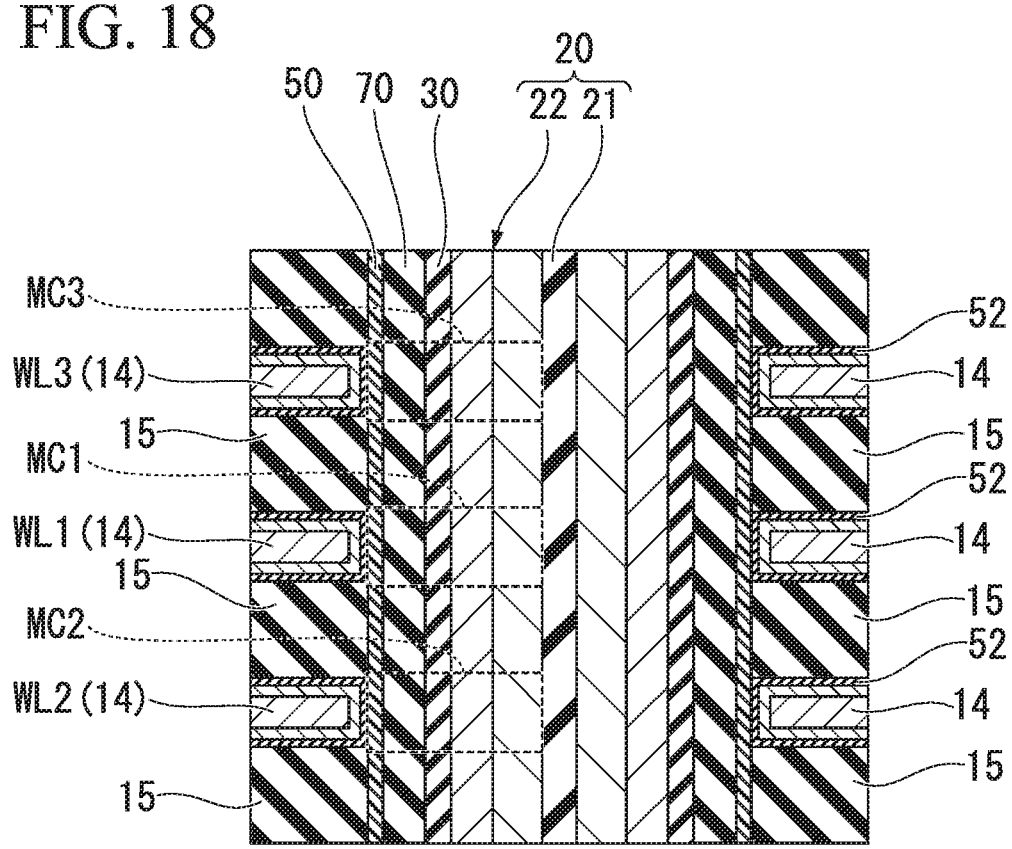
FIG. 18 is a cross-sectional view of a semiconductor memory device according to a comparative example.

A semiconductor memory device that does not have the thin part of the charge-storing film between the insulating layer 15 and the tunnel insulating film 30 will be described as a comparative example. FIG. 18 is a schematic cross-sectional view of the semiconductor memory device according to the comparative example.

In the semiconductor memory device according to the comparative example, a charge-storing film 70 continuously extends uniformly. For this reason, electrons and holes that accumulate in the charge-storing film 70 of a memory cell are more likely to diffuse to neighboring memory cells.

The diffusion of electrons to neighboring memory cells will be described below as a specific example.

For example, it is assumed that a write operation is performed with respect to an arbitrary memory cell MC1 of the semiconductor memory device of the comparative example. In this case, electrons are injected from the semiconductor layer 22 via the tunnel insulating layer 30 into the charge-storing film 70 of the memory cell MC1 in the vicinity of a word line WL1. For this reason, electrons accumulate in the charge-storing film 70 of the memory cell MC1 in the vicinity of the word line WL1.

Further, it is assumed that a data erase operation is performed with respect to a memory cell MC2 and a memory cell MC3 adjacent to the selected memory cell MC1. In this case, electrons accumulated in the charge-storing films 70 of the memory cell MC2 and the memory cell MC3 in the vicinity of the word line WL2 and the word line WL3, respectively, are released to the semiconductor layer 22. For this reason, holes accumulate in the charge-storing films 70 of the memory cell MC2 and the memory cell MC3 in the vicinity of the word line WL2 and the word line WL3, respectively.

Electrons accumulated in the charge-storing film 70 in the vicinity of the memory cell MC1 and holes accumulated in the charge-storing films 70 in the vicinity of the memory cell MC2 and the memory cell MC3 mutually attract. For this reason, electrons and holes accumulated in the charge-storing film 70 diffuse to neighboring memory cells.

If the charge-storing film 70 is formed of, for example, silicon nitride, the hole diffusion coefficient is larger than the electron diffusion coefficient. That is, holes in the charge-storing film 70 diffuse more than electrons. This is because the depth of an energy level of the electron trap of silicon nitride is greater than the depth of an energy level of the hole trap.

Diffusion of the holes in the memory cell MC2 and the memory cell MC3 results in the deterioration of the charge-storing characteristics of the memory cell MC1. This tendency becomes prominent if the distance between adjacent memory cells is small. For example, if the thickness of the insulating layer 15, which determines the size between memory cells, is 35 nm or less, the charge-storing characteristics are more likely to deteriorate.

In contrast, in the semiconductor memory device according to the present embodiment, the charge-storing film 40 has the thin part 40A between the insulating layer 15 and the tunnel insulating film 30. In the thin part 40A, the charge-storing film 40 is thin, and this inhibits the movement of charges.

This configuration can inhibit diffusion of charge between adjacent memory cells. As the result, it is possible to improve the charge-holding characteristics.

Also, according to the present embodiment of the semiconductor memory device, the charge-storing film 40 includes the first-composition film 41 and the second-composition film 42. In the first-composition film 41, charge movement is less likely to occur than in the second-composition film 42. In accordance with these configurations, the first-composition film 41 in at least a part of the thin part 40A can improve the charge-holding characteristics.

At least one part of the second-composition film 42 having more various charge trap levels than the first-composition film is formed at a position overlapping in the position of the conductive layer 14 in Z direction. Because the second composition film 42 sufficiently stores electrons, the electrons are less likely to pass through the blocking insulation film 50 and reach the conductive layer 14. This configuration will suppress deterioration of the blocking insulation film 50 because of electrons passing therethrough during repeated write operations.

According to the semiconductor memory device of the present embodiment, the width of the charge-storing part 40B in Z direction is larger than that of the first surface 14b that contacts the pillars 13 of the conductive layer 14. The width of the charge-storing film 40 increases from the first opposing surface 40c towards the tunnel insulating film 30.

Electrons to be accumulated in the charge-storing film 40 pass through the tunnel insulating film 30, along the lines of electric force generated between the conductive layer 14 and the semiconductor layer 22. The width of the lines of electric force in Z direction increases from the first surface 14b of the conductive layer 14 towards to the semiconductor layer 22 facing the tunnel insulating film 30. The lines of electric force, get more diverted from the first surface 14b to the first opposing surface 40c by an extent according to the thickness of the blocking insulation film 50, compared to the extent at the first surface 14b of the of the conductive layer 14 facing the tunnel insulating film 30.

By widening the part of the charge-storing film 40 in which the lines of electric force are concentrated, the amount of electrons that pass though the charge-storing film 40 and reach the blocking insulation film 50 can be reduced. This is because the amount of electrons trapped by the charge-storing film 40 increases. This configuration suppresses a deterioration of the blocking insulation film 50 caused by repeated passage of electrons.

Some modified examples of the present embodiment will be described below. In these modified examples, elements other than those described below are the same as those in the above-described first embodiment.

Although the charge-storing film 40 shown in FIG. 4 is formed by the first-composition film 41 and the second-composition film 42 having different compositions, the charge-storing film 40 may be a single layer of a material having a same composition, or may be a multi-layer including three or more layers having different compositions.

Figure 19:
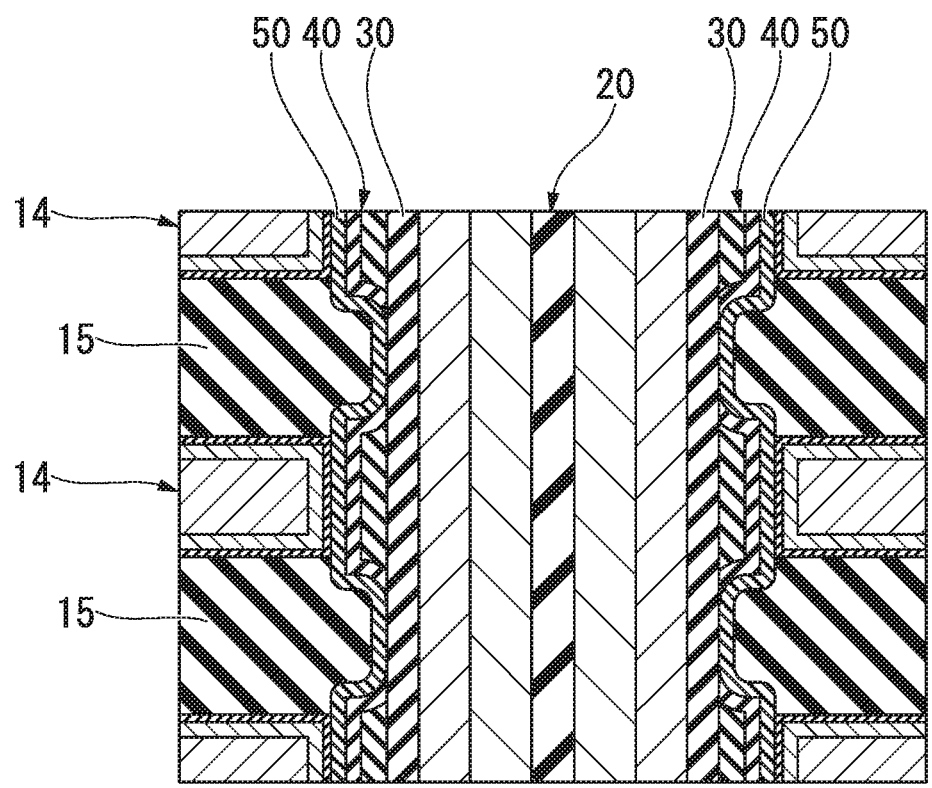
FIG. 19 is a cross-sectional view of a memory area of the semiconductor device according to a modified example of the first embodiment.

FIG. 19 is a cross-sectional view of a memory area of a semiconductor memory device according to a modified example of the present embodiment. As shown in FIG. 19, the charge-storing film 40 is separated between the insulating layers 15 of the multi-layered structure 12 and the tunnel insulating film 30. This modified example corresponds to the case in which the thickness of the thin part 40A is zero. In this case, because the thin part 40A does not exist between the semiconductor body 20 and the insulating layer 15, rather than a continuous "charge-storing film 40," it is a separated "charge-storing film 40." The charge-storing film 40 is formed by only a "charge-storing part" provided at a position corresponding to the conductive layer 14. However, because the charge-storing film 40 is formed as a continuous film through the manufacturing process, it will be referred to as the "charge-storing film" in the present specification for the purpose of the description.

Second Embodiment

Figure 20:
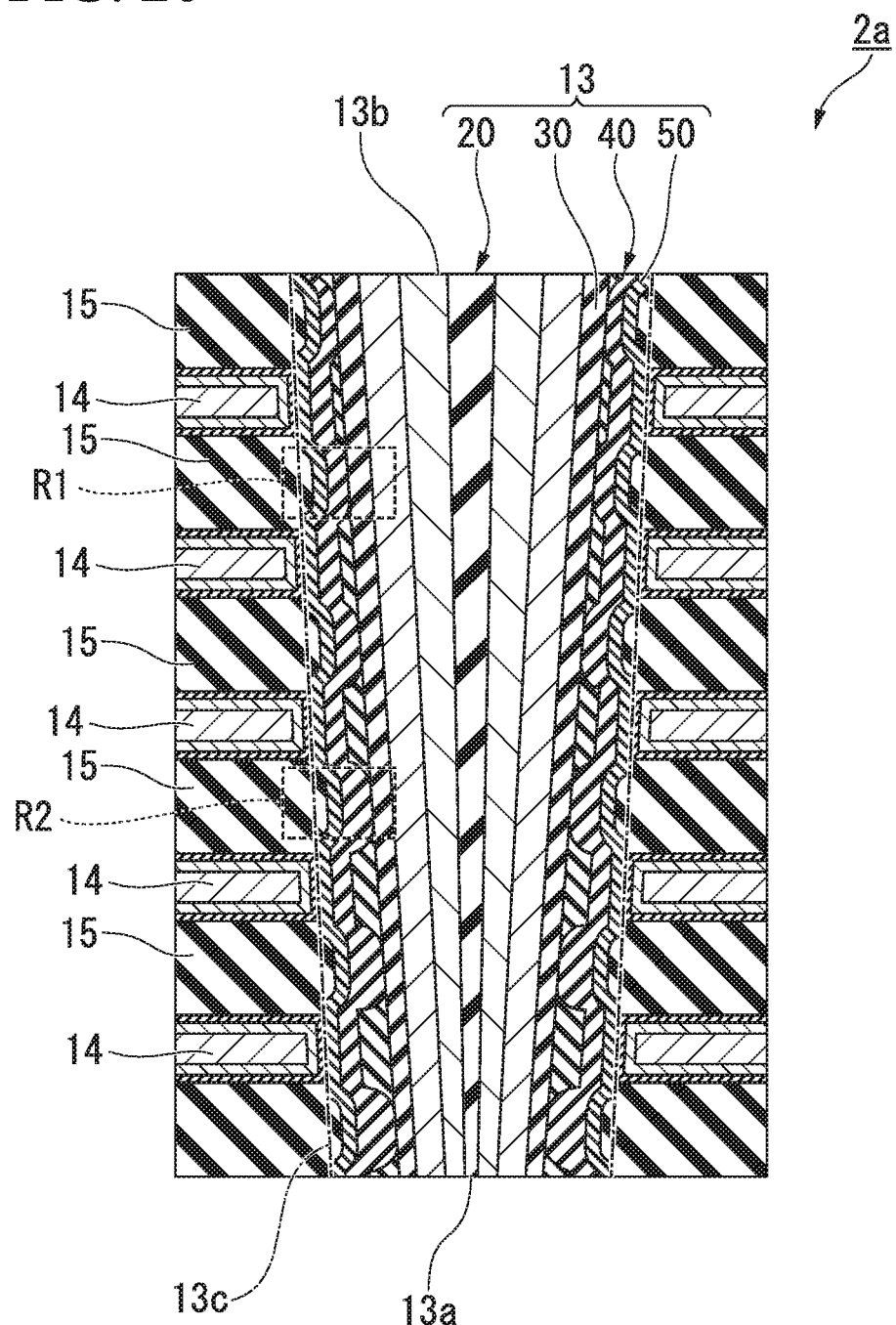
FIG. 20 is a cross-sectional view of a memory area the semiconductor device according to a second embodiment.

A semiconductor memory device according to a second embodiment will be described below with references to FIG. 20 to FIG. 22. FIG. 20 is a schematic cross-sectional view of a memory area 2a of a semiconductor memory device according to the second embodiment.

In the semiconductor memory device of the present embodiment, the diameter of the pillar 13 broadens from a first end 13a on the substrate 11 side toward the second end 13b on the opposite side, differently from the semiconductor memory device of the first embodiment. In other words, the area of a cross-section of the pillar increases as the distance of the cross-section becomes farther from the substrate. In this case, the diameter of the pillar 13 means the diameter of a virtual outside surface 13c that successively joins the boundaries between the conductive layer 14 and the blocking insulation film 50 of a memory cell regarding a plurality of memory cells.

Figure 21:
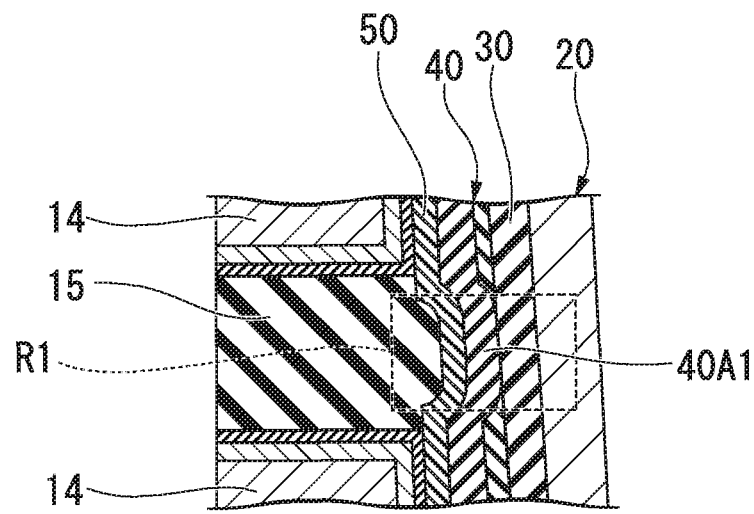
FIG. 21 is an enlarged cross-sectional view of a first region of the memory area according to the second embodiment.

FIG. 21 is an enlarged schematic cross-sectional view of a first region R1 between an arbitrary insulating layer 15 and the tunnel insulating film 30 in the memory area 2a of the second embodiment. FIG. 22 is an enlarged schematic cross-sectional view of a second region R2 between an insulating layer 15 and the tunnel insulating film 30 closer to the substrate 11 side than the first region R1 in the memory area 2a of the second embodiment.

Figure 22:
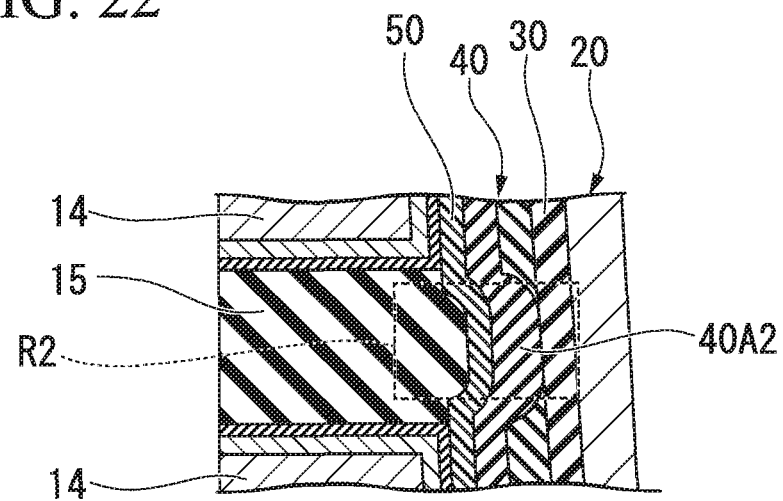
FIG. 22 is an enlarged cross-sectional view of a second region of the memory area according to the second embodiment.

As shown in FIG. 21 and FIG. 22, in the semiconductor memory device of the present embodiment, the thickness of a thin part 40A1 of the charge-storing film 40 in the first region R1 is smaller than the thickness of a thin part 40A2 in the second region R2.

A method of manufacturing a semiconductor memory device of the present embodiment will be described below. The method of manufacturing a semiconductor memory device of the present embodiment is different from the first example of the method of manufacturing a semiconductor memory device of the first embodiment in that the present embodiment includes a process step (FIG. 10) of removing a part of the charge-storing film 40 from the inside of the memory hole MH. In the following, the different part will be specifically described.

According to the first example of the method of manufacturing a semiconductor memory device of the first embodiment, the thickness of the oxide film formed on the inner wall of the charge-storing film 40 by radical oxidation is substantially uniform and not dependent upon the position in Z direction. In contrast, according to the method for manufacturing a semiconductor memory device of the present embodiment, the thickness of the oxide film formed on the inner wall of the charge-storing film 40 by radical oxidation becomes greater, as the distance from the substrate 11 becomes greater.

Methods of making the thickness of the oxide film formed on the inner wall of the charge-storing film 40 wider as the distance from the substrate 11 increases, include, for example, a method of performing radical oxidation processing using a plasma, from the side of the stacked layers 62 (refer to FIG. 9) opposite to the substrate 11.

Alternatively, similar to the radical oxidation in the first example, an oxide film may be formed by directly introducing hydrogen and oxygen into a film deposition chamber and generating water vapor therein. In this case, the pressure inside the film deposition chamber is set to be higher than the condition in the first example, in which an oxide film is substantially uniform and not dependent upon the position in Z direction.

The oxide film formed on the inner wall of the charge-storing film 40 is etched using dilute hydrofluoric acid or the like. By etching the oxide film formed on the inner wall of the charge-storing film 40, a memory hole MH of which diameter expands from the substrate 11 toward the side opposite to the substrate 11 is formed.

Finally, the tunnel insulating film 30 and the semiconductor body 20 are formed inside the memory hole MH, and each of the substitution layers 61 is replaced by the conductive layer 14. The method of forming the tunnel insulating film 30 and the semiconductor body 20, the method of removing the substitution layer 61, and the method of forming the blocking layer 51 and the conductive layer 14 in the spaces 63 after the removal of the substitution layer 61 can be the same methods as used in the first example of the manufacturing method according to the first embodiment.

The semiconductor memory device of the second embodiment shown in FIG. 20 is manufactured according to this procedure.

As shown in FIG. 20, the diameter of the pillar 13 broadens from the first end 13a on the substrate 11 toward the second end 13b opposite thereto. The part of the pillar 13 having a large diameter has more charge flowing in the semiconductor body 20 than the part of the pillar 13 having a small diameter. For that reason, the amount of charge accumulated in a memory cell on the side opposite to the substrate 11 is great, relative to the amount of charge held in a memory cell on the substrate 11 side. That is, the amount of charge moving between neighboring memory cells is greater in the first region R1 than in the second region R2. For that reason, as shown in FIG. 21 and FIG. 22, charge movement can be limited by making the thickness of the thin part 14A1 in the first region R1 smaller than the thickness of the thin part 41A2 in the second region R2.

According to a semiconductor memory device having this configuration, similar to the semiconductor memory device of the first embodiment, the charge-holding characteristics of the semiconductor memory device can be improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a substrate;
   a multi-layered structure including a plurality of insulating layers and a plurality of conductive layers that are alternately formed above the substrate; and
   a pillar extending through the multi-layered structure, the pillar including
      a semiconductor body extending along the pillar,
      a tunnel insulating film provided between the multi-layered structure and the semiconductor body,
      a block insulating film provided between the multi-layered structure and the tunnel insulating film, and
      a charge-storing film between the tunnel insulating film and the block insulating film, the charge-storing film having a first thickness at first portions facing the insulating layers and a second thickness greater than the first thickness at second portions facing the conductive layers.

2. The semiconductor memory device according to claim 1, wherein
   the charge-storing film has a stacked structure of a first-composition film and a second-composition film, the second-composition film having a larger electric charge trap level than the first-composition film.

3. The semiconductor memory device according to claim 2, wherein
   the first-composition film includes silicon nitride that is more silicon-rich than the second-composition film, which includes silicon nitride or silicon oxynitride.

4. The semiconductor memory device according to claim 2,
   wherein the second-composition film is between the conductive layer and the tunnel insulating film.

5. The semiconductor memory device according to claim 4, wherein the first-composition film is in direct contact with the tunnel insulating film at the first portions of the charge-storing film.

6. The semiconductor memory device according to claim 4, wherein the first-composition film continuously extends through the multi-layered structure and the second-composition film does not continuously extend through the multi-layered structure.

7. The semiconductor memory device according to claim 1, wherein the block insulating film is in contact with the first-composition film but not in contact with the second-composition film.

8. The semiconductor memory device according to claim 1, wherein a center portion of each of the insulating portions in a thickness direction thereof protrudes towards the semiconductor body.

9. The semiconductor memory device according to claim 1, wherein the second portions of the charge-storing film having the second thickness each face one of the conductive layers and extend along an extension direction of the pillar, and a length of each second portion in the extension direction is greater than a thickness of the corresponding conductive layer in the extension direction.

10. The semiconductor memory device according to claim 9, wherein the first portions of the charge-storing film having the first thickness each face one of the insulating layers and extend along the extension direction, and a length of each first portion in the extension direction is less than a thickness of the corresponding insulating layer in the extension direction.

11. The semiconductor memory device according to claim 10, wherein the charge-storing film has third portions between the first and second portions in the extension direction, the third portions having a varying thickness between the first thickness and the second thickness.

12. The semiconductor memory device according to claim 1, wherein an area of a cross-section of the pillar increases as the distance of the cross-section becomes farther from the substrate.

13. A semiconductor memory device comprising:
    a substrate;
    a multi-layered structure including a plurality of insulating layers and a plurality of conductive layers that are alternately formed above the substrate; and
    a pillar extending through the multi-layered structure, the pillar including
       a semiconductor body extending along the pillar,
       a tunnel insulating film provided between the multi-layered structure and the semiconductor body,
       a block insulating film provided between the multi-layered structure and the tunnel insulating film, and
       a charge-storing film between the tunnel insulating film and the block insulating film, the charge-storing film having a first thickness at a first portion, a second thickness that is greater than the first thickness at a second portion, and variable thickness between the first and second thicknesses at a third portion between the first portion and the second portion.

14. The semiconductor memory device according to claim 13, wherein the first portion faces one of the insulating layers, and the second portion faces one of the conductive layers.

15. The semiconductor memory device according to claim 14, wherein the first portion, the third portion, and the second portion form one continuous portion of the charge-storing film.

16. The semiconductor memory device according to claim 15, wherein the insulating layer facing the first portion protrudes towards the semiconductor body.

17. The semiconductor memory device according to claim 13, wherein
    the charge-storing film has a stacked structure of a first-composition film and a second-composition film, the second-composition film having a larger electric charge trap level than the first-composition film.

18. The semiconductor memory device according to claim 17, wherein
    the first-composition film includes silicon nitride that is more silicon-rich than the second-composition film, which includes silicon nitride or silicon oxynitride.

19. The semiconductor memory device according to claim 13, wherein an area of a cross-section of the pillar increases as the distance of the cross-section becomes farther from the substrate.

* * * * *